(12) United States Patent
Takeuchi et al.

(10) Patent No.: US 7,508,493 B2
(45) Date of Patent: Mar. 24, 2009

(54) EXPOSURE APPARATUS AND DEVICE MANUFACTURING METHOD

(75) Inventors: Seiji Takeuchi, Utsunomiya (JP); Kenji Yamazoe, Utsunomiya (JP); Yumiko Ohsaki, Utsunomiya (JP); Minoru Yoshii, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 15 days.

(21) Appl. No.: 11/675,204

(22) Filed: Feb. 15, 2007

(65) Prior Publication Data
US 2007/0188730 A1    Aug. 16, 2007

(30) Foreign Application Priority Data
Feb. 15, 2006    (JP)    ............... 2006-037422

(51) Int. Cl.
*G03B 27/72*    (2006.01)
(52) U.S. Cl. .......................... 355/71; 355/69
(58) Field of Classification Search .................. 355/53, 355/55, 67, 71; 250/548
See application file for complete search history.

(56) References Cited
U.S. PATENT DOCUMENTS
7,130,025 B2 * 10/2006 Tsuji ........................... 355/71

2003/0234348 A1    12/2003 Takeuchi et al.
2004/0248043 A1*   12/2004 Shiraishi ..................... 430/311
2005/0206871 A1    9/2005  Tsuji
2006/0012769 A1    1/2006  Suzuki
2008/0074632 A1*   3/2008  Tanitsu et al. ................. 355/71

FOREIGN PATENT DOCUMENTS
JP    2003-329516    11/2003
JP    2005-166871    6/2005
JP    2005-268489    9/2005

* cited by examiner

*Primary Examiner*—Hung Henry Nguyen
(74) *Attorney, Agent, or Firm*—Locke Lord Bissell & Liddell LLP

(57) ABSTRACT

An exposure apparatus includes an illumination optical system configured to illuminate a reticle, a projection optical system configured to project a pattern of the reticle onto a substrate, a polarization adjuster configured to independently adjust each polarization state of plural areas in an effective light source distribution used to illuminate the reticle, a polarization measurement unit configured to measure a polarization state of light that has passed the polarization adjuster, and a controller configured to independently control each polarization state of the plural areas via the polarization adjuster based on a measurement result of the polarization measurement unit.

10 Claims, 19 Drawing Sheets

100

EXPOSURE APPARATUS AND DEVICE MANUFACTURING METHOD

BACKGROUND OF THE INVENTION

The present invention relates to an exposure apparatus and a device manufacturing method.

A conventional projection exposure apparatus projects a circuit pattern of a reticle (mask) onto a wafer via a projection optical system in manufacturing semiconductor devices using the photolithography technology.

Along with a demand for fine processing to a semiconductor device, a recently proposed exposure apparatus can expose a pattern as small as half an exposure wavelength. A shorter wavelength of the exposure light and a higher numerical aperture ("NA") of the projection optical system are used for such a high resolution. An increase of a NA of the projection optical system means an increase of an angle between a perpendicular from an image plane and a traveling direction of the incident light, and is referred to as high NA imaging.

A polarization of the exposure light is crucial to high NA imaging. For example, in exposing a so-called line and space ("L & S") pattern that has a repetition of a line and a space, the L & S pattern is formed by plane-wave two-beam interference. An incident plane is defined as a plane that contains incident direction vectors of two beams. S-polarized light is polarized light having an electric field vector perpendicular to the incident plane, and p-polarized light is polarized light having an electric field vector parallel to the incident plane. When an angle between incident direction vectors of two beams is 90°, the s-polarized beams interfere with each other and form a light intensity distribution corresponding to the L & S pattern on the image plane. On the other hand, the p-polarized beams do not interfere with each other because their electric vectors are orthogonal (or cancel out the interference effect), and the light intensity distribution becomes constant. As a consequence, no light intensity distribution corresponding to the L & S pattern is formed on the image plane. The contrast of the light intensity distribution for a mixture of the s-polarized light and the p-polarized light becomes worse on the image plane than that with only s-polarized light. As the p-polarized light ratio increases, the contrast of the light intensity distribution on the image plane lowers and finally provides no pattern.

Hence, control over the polarization state of the exposure light is necessary. For example, one proposed exposure apparatus realizes a tangential illumination by controlling the polarization state of the exposure light with a half waveplate. See Japanese Patent Application, Publication No. 2005-166871. Another proposed exposure apparatus measures the polarization state of the exposure light in the illumination optical system, and feeds the measurement result back or forward to the light source or the exposure apparatus. See Japanese Patent Applications, Publication Nos. 2005-268489 and 2003-329516. The polarization-controlled exposure light can form a light intensity distribution having a sufficient contrast on the image plane, and can expose finer patterns.

The polarization illumination in the exposure apparatus needs the light that illuminates the reticle to have a desired polarization state, or the light that forms an image on the substrate to have a desired polarization state. In addition, control over a polarization state of the exposure light at a pupil position in the illumination optical system is not always maintained on the image plane due to the influence of the optical system after the pupil position in the illumination optical system and the projection optical system. For example, due to the birefringence of a glass material and a polarization characteristic of a mirror in the illumination and projection optical systems, a polarization state changes partially (in each area of the polarization illumination) or varies with time.

However, prior art propose general control over the polarization state of the polarization illumination, and is silent about independent (or individual) controls over respective areas in the polarization illumination. Therefore, the prior art cannot handle changes of the polarization state in each area of the polarization illumination, or cannot maintain the desired polarization state. In addition, the exposure apparatus disclosed in Japanese Patent Application, Publication No. 2005-166871 particularly needs a detachment of a polarization controller from the exposure apparatus, when the polarization state varies with time, so as to adjust the polarization controller to the desired polarization state, lowering the throughput.

SUMMARY OF THE INVENTION

The present invention is directed to an exposure apparatus that precisely controls a polarization state of exposure light without lowering a throughput, and can improve the resolution.

An exposure apparatus according to one aspect of the present invention includes an illumination optical system configured to illuminate a reticle, a projection optical system configured to project a pattern of the reticle onto a substrate, a polarization adjuster configured to independently adjust each polarization state of plural areas in an effective light source distribution used to illuminate the reticle, a polarization measurement unit configured to measure a polarization state of light that has passed the polarization adjuster, and a controller configured to independently control each polarization state of the plural areas via the polarization adjuster based on a measurement result of the polarization measurement unit.

A further object and other characteristics of the present invention will be made clear by the preferred embodiments described below referring to accompanying drawings.

DESCRIPTION OF THE EMBODIMENTS

Figure 1:
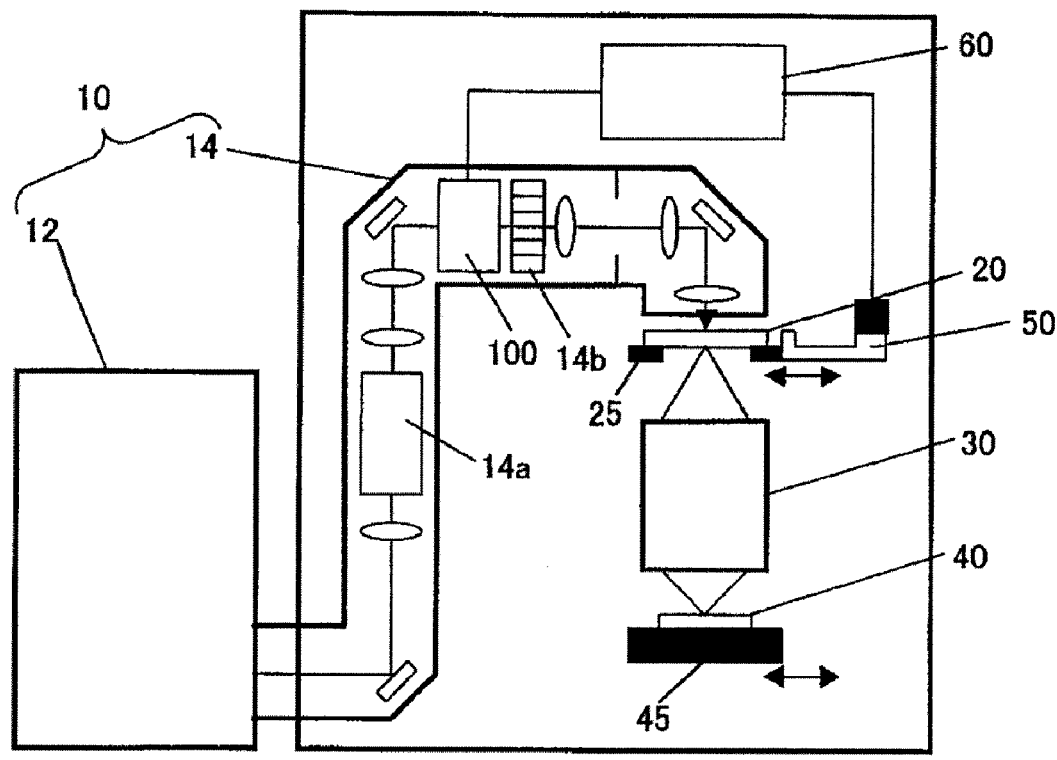
FIG. 1 is a schematic sectional view showing a structure of an exposure apparatus according to one aspect of the present invention.

Referring now to the accompanying drawings, a description will be given of an exposure apparatus according to one aspect of the present invention. In each figure, the same reference numeral designates the same element, and a duplicate description thereof will be omitted. Here, FIG. 1 is a schematic sectional view showing a structure of an exposure apparatus 1 according to the present invention.

The exposure apparatus 1 is a projection optical system that irradiates the light emitted from the light source 12 onto a wafer 40 via plural optical systems, and exposes a circuit pattern of a reticle 20 onto the wafer 40. The exposure apparatus 1 uses a step-and-scan exposure manner, but may use a step-and-repeat manner. The following embodiment discusses a step-and-scan exposure apparatus.

The exposure apparatus 1 includes, as shown in FIG. 1, an illumination apparatus 10, a reticle stage 25 mounted with a reticle 20, a projection optical system 30, a wafer stage 45 mounted with a wafer 40, a polarization measurement unit 50, a controller 60, and a polarization adjuster 100.

The illumination apparatus 10 uniformly illuminates, with an even angular distribution, the reticle 20 that has a circuit pattern to be transferred, and includes a light source section 12 and an illumination optical system 14.

The light source section 12 uses an ArF excimer laser with the wavelength of approximately 193 nm or an KrF excimer laser with a wavelength of approximately 243 nm in this embodiment. However, a type of the light source can be an $F_2$ laser with a wavelength of approximately 157 nm. The number of lasers is not limited. An ultra high pressure mercury lamp having an output of 500 W or greater, a xenon lamp, g-line (with a wavelength of about 436 nm) and i-line (with a wavelength of about 365 nm) of the mercury lamp may also be used.

The light source section 14 is an optical system that illuminates the reticle 20 on a target plane to be illuminated, and includes a lens, a mirror, an optical integrator (fly-eye lens), an aperture stop, etc. The illumination optical system 14 of this embodiment includes a beam shaping optical system 14a and a fly-eye lens 14b.

The beam shaping optical system 14a converts a beam shape of the light from the light source section 12 into a desired one. The beam shaping system 14a uses a beam expander with a plurality of cylindrical lenses. The beam shaping optical system 14a coverts an aspect ratio of a size of a sectional shape of parallel light from the light source section 12 into a desired value (for example, by changing the sectional shape from a rectangle to a square). The beam shaping optical system 14a forms a beam that has a size and a divergent angle necessary to illuminate a fly-eye lens 14b.

The fly-eye lens 14b serves to uniformly illuminate the reticle 20. The fly-eye lens 14b uses a wavefront splitting light integrator that splits the wavefront of the incident light, and forms plural light sources on or near the exit plane. The fly-eye lens 14b converts an angular distribution of the incident light into a positional distribution in exiting the light. The incident plane and the exit plane of the fly-eye lens 14b have a Fourier transformation relationship. Thereby, a secondary light source is formed near the exit plane of the fly-eye lens 14b. Here, the Fourier transformation relationship means an optical relationship between a pupil plane and an object plane (or an image plane).

The fly-eye lens 14b of this embodiment is a combination of plural rod lenses or fine lens elements, but is not limited to the wavefront splitting light integrator. For example, the fly-eye lens 14b may be replaced with plural pairs of cylindrical lens array plates while each pair is orthogonal to each other. The fly-eye lens 14b may use a fly-eye lens in which each rod lens has three or more refractive surfaces.

The reticle 20 has a circuit pattern to be transferred, and is supported and driven by the reticle stage 25.

The projection optical system 30 projects the diffracted light that has passed the pattern of the reticle 20, onto the wafer 40. The projection optical system 30 can use a dioptric, catadioptric, or catoptric optical system.

The wafer 40 is supported and driven by the wafer stage 45. While this embodiment uses the wafer as a substrate, the substrate can use a liquid crystal substrate and a glass plate. A photoresist is applied onto the surface of the wafer 40. The reticle 20 and the wafer 40 are synchronously scanned, and a laser interferometer, etc. measures a position of the reticle stage 25 and a position of the reticle stage 45 so as to drive them at a constant speed ratio.

The polarization measurement unit 50 measures a polarization state or distribution of the light that has been emitted from the light source section 12, and passed the polarization adjuster 100. The polarization measurement unit 50 is arranged on a plane equivalent to the reticle 20 or the wafer 40. The polarization measurement unit 50 of this embodiment is arranged on the reticle stage 25, and measures the polarization state in the effective light source distribution used to illuminate the reticle 20. However, the polarization measurement unit 50 may be arranged on the wafer stage 45.

The effective light source distribution is a light intensity distribution which the illumination apparatus 10 forms on a pupil plane in the projection optical system 30, when the reticle 20 is not arranged on the target plane (or an object plane of the projection optical system 30). The effective light source distribution corresponds to an angular distribution of the light used to illuminate the reticle or the target plane, and an angular distribution of the light incident upon the wafer 40 (or the image plane of the projection optical system 30) when the reticle 20 is not arranged on the target plane.

Figure 2:
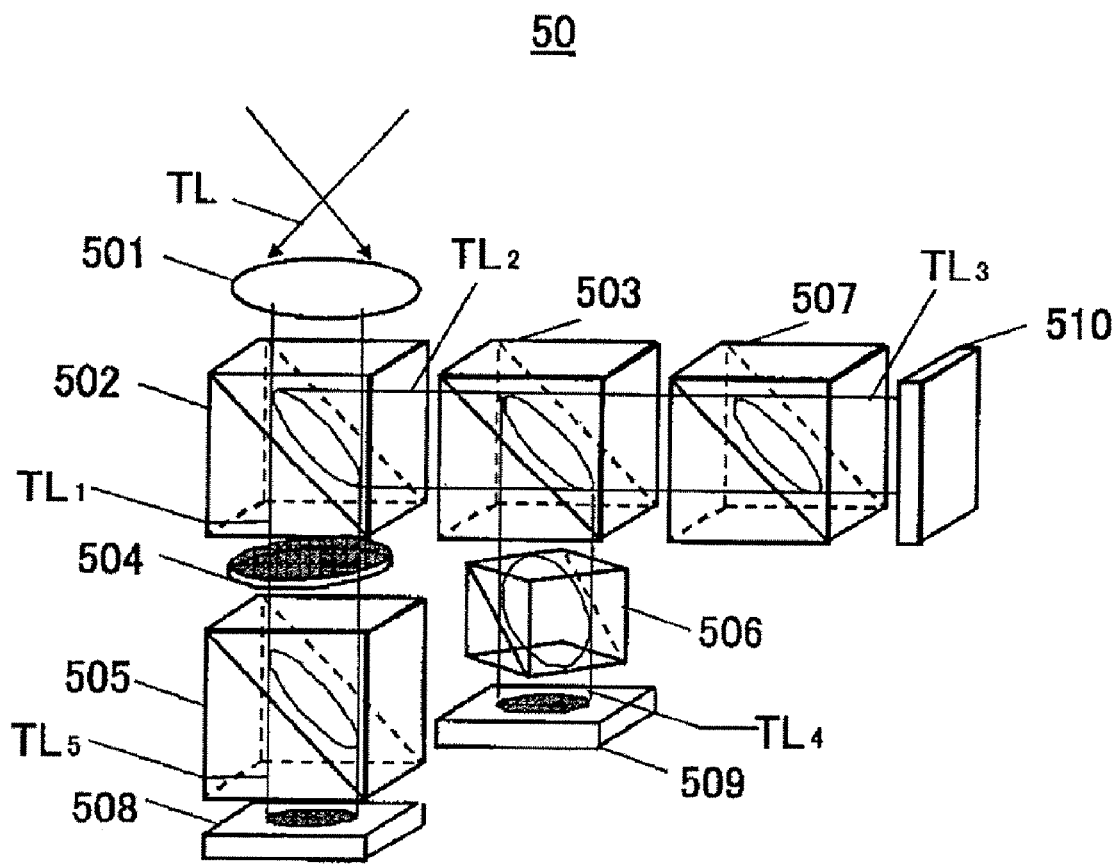
FIG. 2 is a schematic perspective view showing one illustrative, specific structure of a polarization measurement unit in the exposure apparatus shown in FIG. 1.

FIG. 2 is a schematic perspective view showing a specific structure of the polarization measurement unit 50. The structure of the polarization measurement unit 50 shown in FIG. 2 is for mere illustrative purposes, and another structure is applicable to the exposure apparatus 1.

The polarization measurement unit 50 includes a collimator lens 501, non-polarization beam splitters 502 and 503, a quarter waveplate 504, polarizers 505, 506, and 507, and two-dimensional photodetectors 508, 509, and 510, and measures the polarization state of target light TL. The polarizers 505, 506 and 507 use a Rochon prism, a Glan-Thompson prism, etc. The two-dimensional photodetectors 508, 509, and 510 use a CCD, etc.

The target light TL is the light that has passed the illumination optical system 14, or condensed light that has passed the projection optical system 30. The target optical system TL that passes the condensing point and starts diverging, is converted into approximately collimated light by the collimator lens 501 having a positive refractive index. The approximately collimated light passes the non-polarization beam splitter 502, and is split into transmitting light $TL_1$ and reflected light $TL_2$. The non-polarization beam splitters 502 and 503 preferably use a half mirror that does not change a polarization state, but a half mirror having a known polarization characteristic can be used because the polarization state is correctable.

While FIG. 2 uses a cube type non-polarization beam splitter, another shaped non-polarization beam splitter may be used. The reflected light $TL_2$ passes the non-polarization beam splitter 503, and is further split into transmitting light $TL_3$ and reflected light $TL_4$. Three split rays, i.e., the light $TL_3$, the light $TL_4$ and the light $TL_5$ pass the polarizers 507, 506 and the quarter waveplate 504 and the polarizer 505, and enter the two-dimensional photodetectors 510, 509 and 508. The polarizer 507 is configured to transmit a polarized light component having an electric field component that oscillates in the reference X-axis direction. On the other hand, the polarizer 506 is configured to transmit a polarization component having an electric field component that oscillates in the 45° direction relative to the reference X-axis direction. The two-dimensional photodetector 510 and 509 respectively detect a horizontal, linearly polarized light component, and a 45°, linearly polarized light component.

The quarter waveplate 504 is a quarter waveplate to the wavelength of the target light TL, and its fast axis inclines by 45° to the reference X-axis direction. The polarizer 505 is configured to transmit the polarized light that oscillates in the Y-axis direction that is orthogonal to the reference X-axis direction. As a result, a right-handed circularly polarized light component is extracted as light $TL_5$, and detected by the two-dimensional photodetector 508.

The intensity of the horizontally polarized light component, the intensity of the 45° polarized light component, and the intensity of right-handed circularly polarized light component detected by the two-dimensional photodetectors 510, 509, and 508 are operated for each point corresponding to the light. Thereby, a Stokes parameter and a Jones matrix are calculated as a light distribution.

The collimator lens 501 of this embodiment is a lens having positive refractive power, but a similar effect can be obtained by arranging a lens having negative refractive power and by collimating the target light TL into parallel light. The birefringence of the collimator lens 501 and birefringence of another element are pre-measured, and the control is corrected based on the measurement result.

The controller 60 includes a CPU and a memory (not shown), and controls operations of the exposure apparatus 1.

The controller 60 is electrically connected to the illumination apparatus 10, the reticle stage 25, the wafer stage 45, the polarization measurement unit 50, and the polarization adjuster 100. The controller 60 of this embodiment controls the polarization adjuster 100 based on a measurement result by the polarization measurement unit 50. As detailed later, the controller 60 independently controls each polarization state of plural areas in the effective light source distribution used to illuminate the reticle 20 via the polarization adjuster 100.

The polarization adjuster 100 of this embodiment is arranged at the incident (or light source section) side of the fly-eye lens 14b. Alternatively, the polarization adjuster 100 may be arranged at the exit (or wafer) side of the fly-eye lens 14b. A position of the polarization adjuster does not have to always accord with the pupil position in the illumination optical system, and may be near the pupil position as long as the polarization adjuster exhibits an effect as if it is provided on the pupil position.

Figure 3:
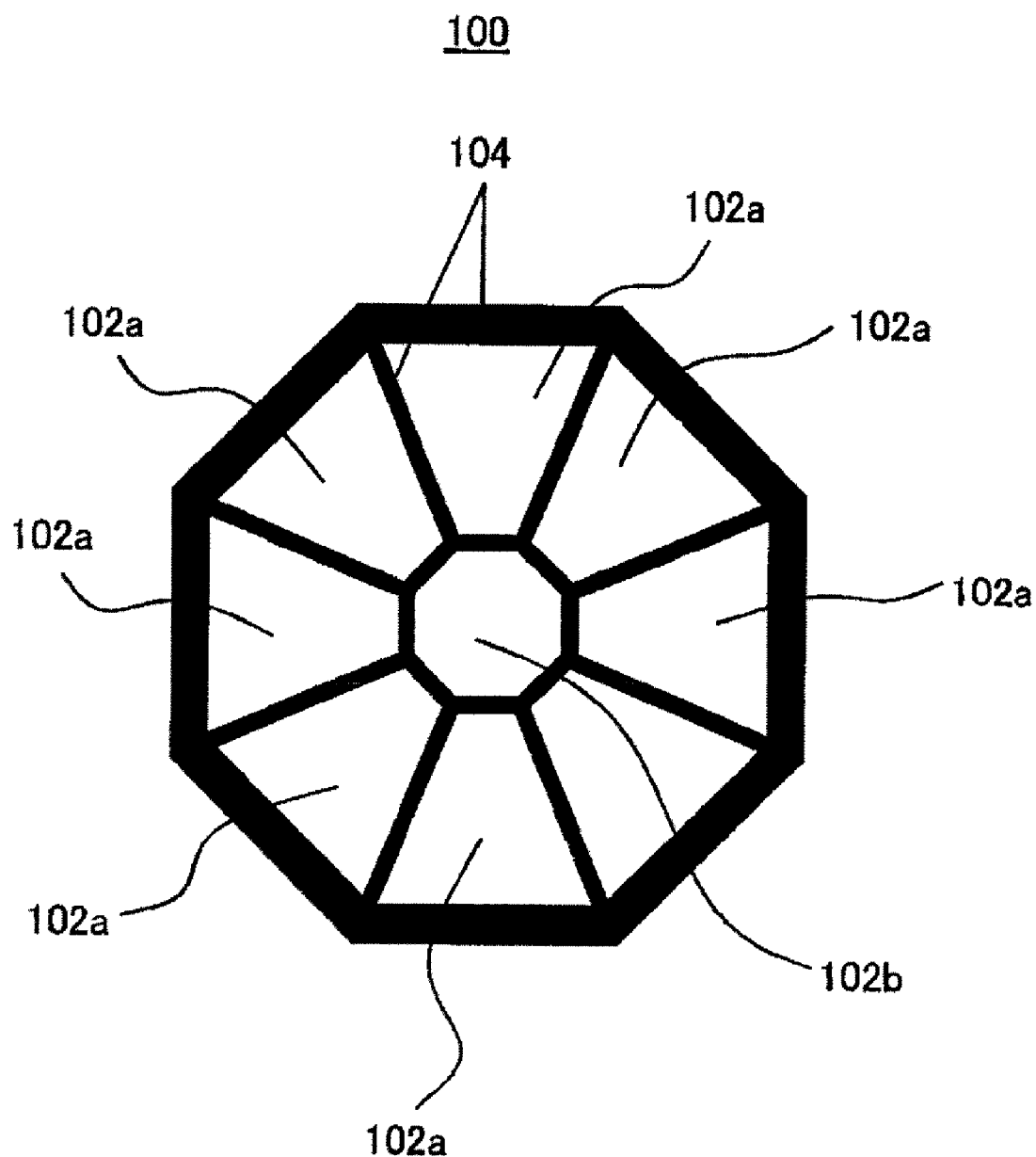
FIG. 3 is a schematic plane view showing a structure of a polarization adjuster in the exposure apparatus shown in FIG. 1.

FIG. 3 is a schematic plane view of a structure of the polarization adjuster 100. The polarization adjuster 100 includes nine waveplates 102a and 102b arranged at the pupil position in the illumination optical system 14. In addition, nine waveplates are located on a plane perpendicular to the optical axis of illumination optical system 14. A waveplate shifts the relative phase of the two perpendicular polarization components of an incident light. A waveplate is also called by the names, retarder or retardation plate. Specifically, a quarter waveplate shifts the relative phase of the two perpendicular polarization components by quarter of a wavelength and a half waveplate shifts by half of a wavelength.

A holder frame 104 holds the waveplates 102a and 102b. Two polarization adjusters 100 stack in the optical axis direction as shown in FIG. 3. One polarization adjuster 100 serves as a half waveplate, and the other serves as a quarter waveplate. The nine waveplates 102a and 102b are rotatably configured by a fine angle (±3° to ±10°). The polarization adjuster 100 serves to rotate the holder frame 104 (or the nine waveplates 102a and 102b entirely).

Figure 4:
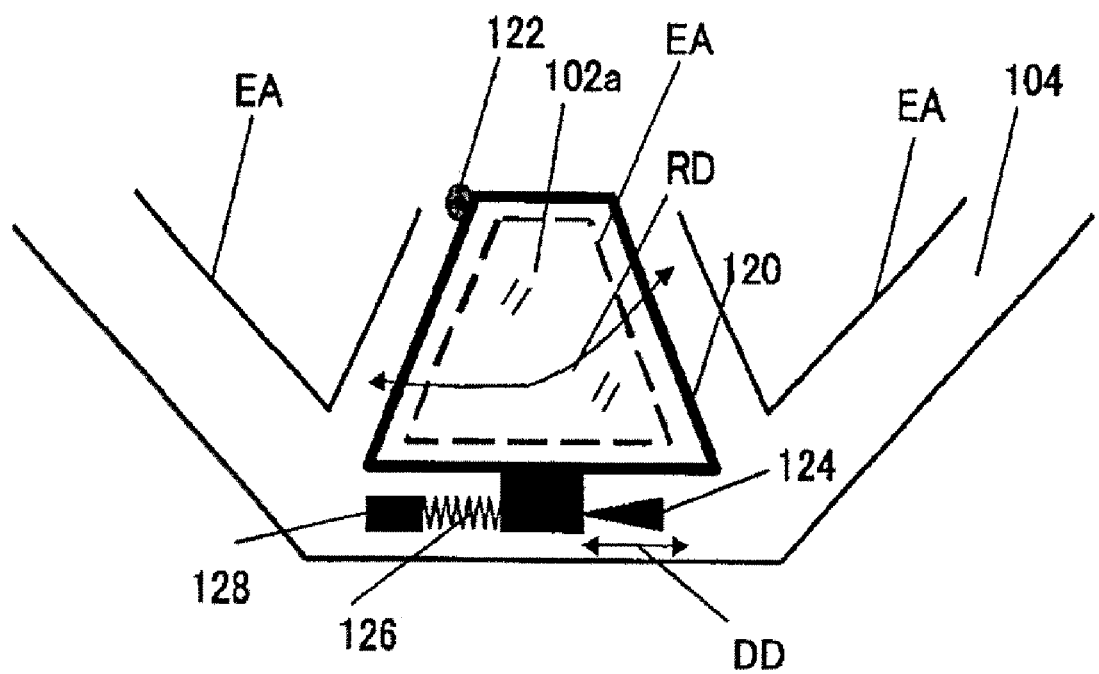
FIG. 4 is an enlarged plane view showing a structure of one waveplate in the polarization adjuster shown in FIG. 3.

FIG. 4 is an enlarged plane view of a structure of one waveplate 102a held by the holder frame 104. In FIG. 4, 120 denotes a waveplate frame, 122 denotes a pivot mechanism that serves as a axis of rotation of the waveplate 102a. The rotation mechanism 122 is engaged with a rotation pin that protrudes from the holder frame 104 via a pivot ring attached to the waveplate frame 120.

124 denotes an actuator, 126 denotes a spring mechanism, and 128 denotes a projection of the holder frame 104. DD is a driving direction of the actuator 124, RD is a rotating direction of the waveplate 102a, and EA is an effective area EA of the waveplate 102a. FIG. 4 also shows the effective area EA of the adjacent waveplate 102a.

The driving mechanism that drives the waveplate frame 120 and the waveplate 102a are arranged behind the holder frame 104 so that they do not block the light that passes the effective area EA of the waveplate 102a. When the actuator 124 moves in the driving direction DD in response to a command from the controller 60, the waveplate 102a moves in the rotating direction RD around the pivot mechanism 122. A similar driving mechanism is arranged for eight trapezoids waveplates 102a, and the octagonal waveplate 102b at the center of the polarization adjuster 100. The driving mechanism of this embodiment is one example, and another driving mechanism may be used. For example, holding peripheral parts of the waveplates 102a and 102b may be processed with a comb gear shape, and rotated by a rotatable actuator having a gear.

Figure 5:
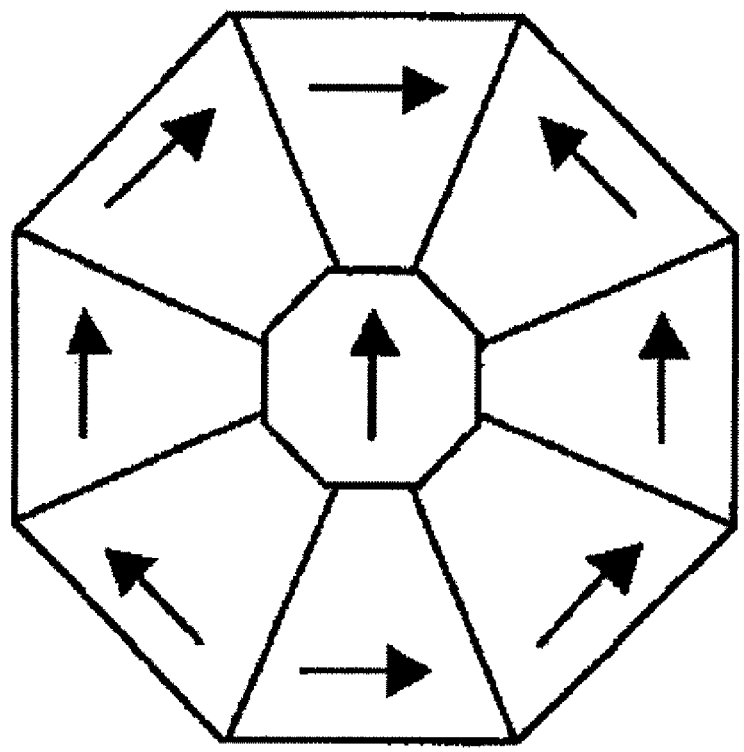
FIG. 5 shows an electric vector distribution of the tangentially polarized light that is generally used for the polarization illumination.
Figure 6:
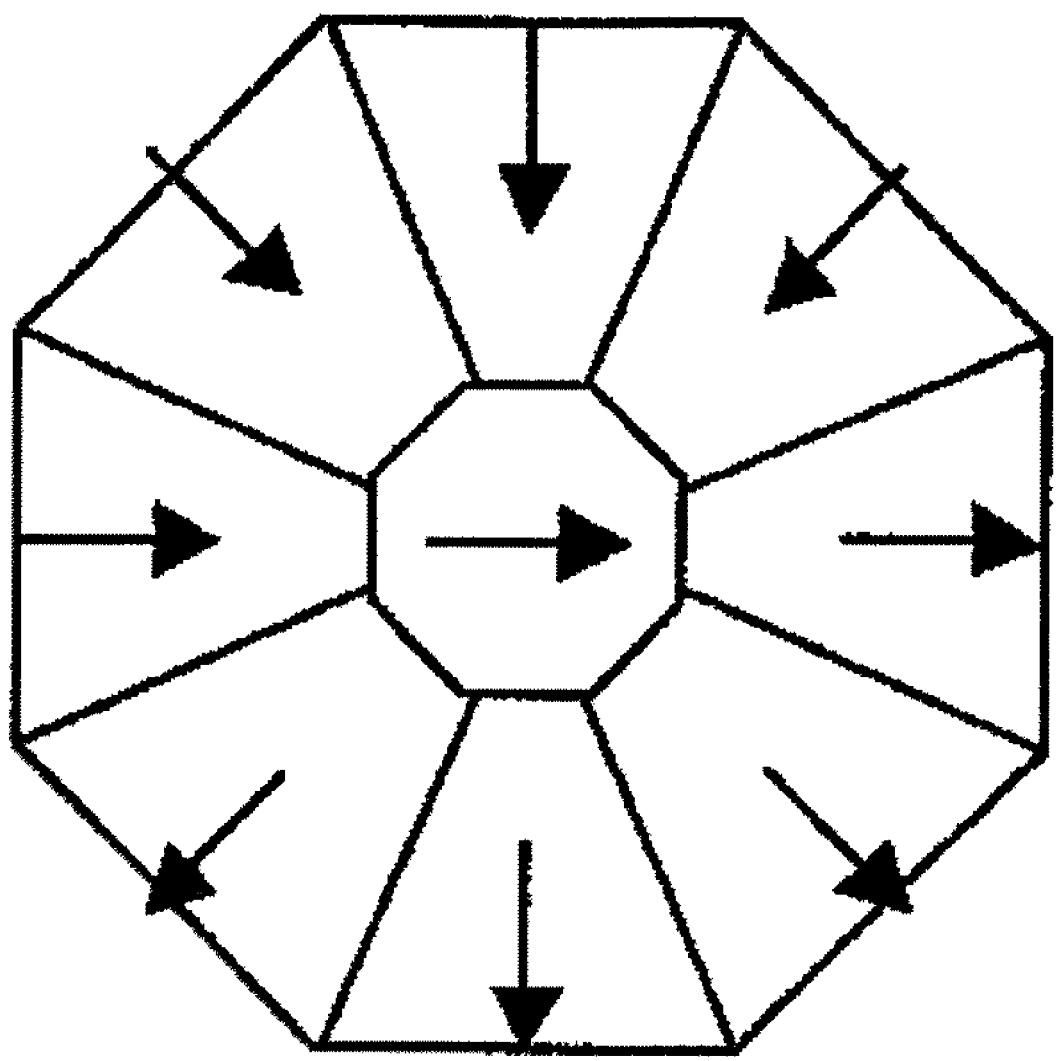
FIG. 6 shows an electric vector distribution of the radially polarized light that is generally used for the polarization illumination.

A detailed description will be given of waveplates 102a and 102b in the polarization adjuster 100. FIGS. 5 and 6 show electric vector distributions of the tangentially polarized light and the radially polarized light that are generally used for the polarization illumination. FIGS. 5 and 6 show a distribution on the pupil plane in the illumination optical system 14, and electric vector of the polarized light in the waveplates 102a and 102b.

The polarization vector shown in FIG. 5 is referred to as tangentially polarized light since it turns toward a tangential direction on the pupil plane of the illumination optical system 14. The tangentially polarized light is particularly suitable for imaging a periodic L & S. On the other hand, the polarization vector shown in FIG. 6 turns towards a radial direction on the pupil plane in the illumination optical system 14, and is referred to as the radially polarized light. The radially polarized light is particularly suitable for imaging a contact hole pattern. In the polarization vector shown in FIGS. 5 and 6, two arbitrary areas that hold the central area (corresponding to the waveplate 102b) turn towards the same direction, but this is not essential. Since the vector indicates the oscillation direction of the electric field, the direction may be opposite in this embodiment.

Figure 7:
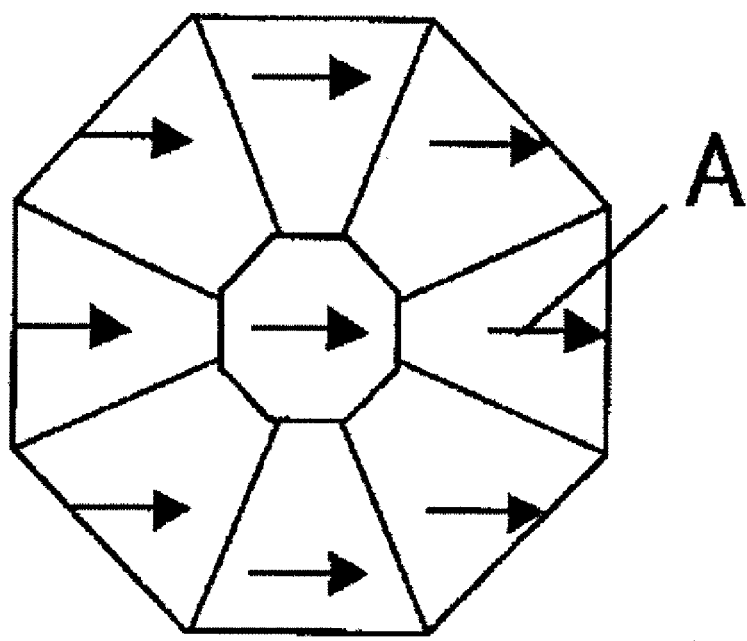
FIG. 7 illustrates linearly polarized light in a beam emitted from a light source section in the exposure apparatus shown in FIG. 1.

In the illumination optical system 14, the light emitted from the light source section 12 maintains its polarization state and enters the polarization adjuster 100. The light incident upon each of the waveplates 102a and 102b is approximately linearly polarized light, as shown in FIG. 7. FIG. 7 shows that the light from the light source section 12 is incident as the x-polarized light (that is polarized light having a laterally oscillating electric vector) upon the polarization adjuster 100. Here, FIG. 7 is a view showing one illustrative, linearly polarized light of the beam exited from the light source section 12.

Figure 8:
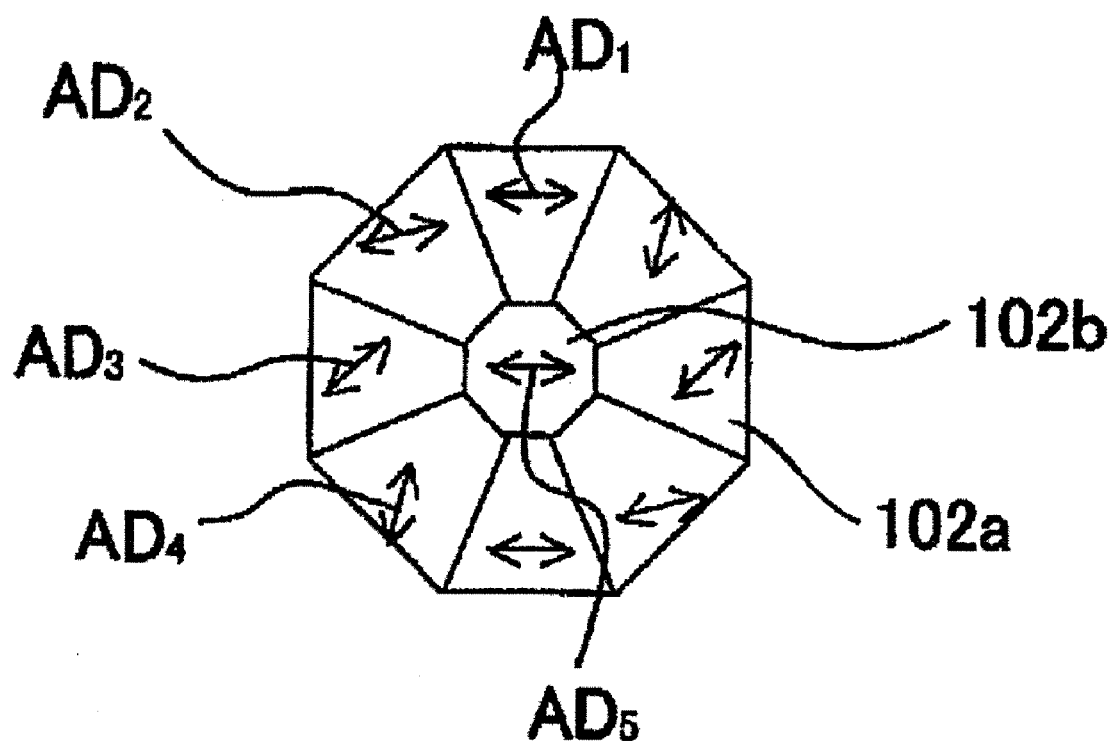
FIG. 8 is a schematic plane view of the polarization adjuster that coverts incident light having x-polarized light into the tangentially polarized light shown in FIG. 5.

FIG. 8 is a schematic plane view of the polarization adjuster 100 that converts the incident light having x-polarized light into the tangentially polarized light shown in FIG. 5. The waveplates 102a and 102b in the polarization adjuster 100 shown in FIG. 8 serve as half waveplates relative to the exposure wavelength, and has fast axis angles shown by arrows $AD_1$ to $AD_5$. The fast axes of the waveplates 102a and 102b can be set to desired initial fast axis angles by properly cutting the crystalline axis in cutting the waveplate. Phases of the waveplates 102a and 102b are processed into the quarter waveplate or the half waveplate by controlling a thickness in polishing the crystalline material. The crystalline material for the waveplate usable for the wavelength of 193 nm is generally, but not limited to, magnesium fluoride, as long as the material has proper transmission and birefringence characteristics to the wavelength of 193 nm.

The arrows $AD_1$ to $AD_5$ denote fast axes of the waveplates 102a and 102b, as described above. The half waveplate serves to rotate an angle of the incident polarized light by $2\theta$, where $\theta$ is an angle between the incident polarized light and the fast axis. For example, the waveplate 102a having a fast axis indicated by the arrow $AD_3$ and the fast axis of the waveplate 102a arranged at a symmetrical position with respect to the center is set to 45°. In this case, the polarized light emitted from each effective area of these two waveplates 102a is emitted as y-polarized light (that is longitudinally oscillating polarized light). Similarly, the emitted polarized light turns into 45° when the fast axis angle indicated by the arrow $AD_2$ is set to 22.5°. The emitted polarized light turns into 135° when the fast axis angle indicated by the arrow $AD_4$ is set to 67.5°. The incident polarized light as the x-polarized light is not affected by the waveplate 102a and emitted as the x-polarized light, when the fast axis angle indicated by the arrow $AD_1$ is set to 0°. Thus, the polarization adjuster 100 can convert the x-polarized light shown in FIG. 7 into the tangentially polarized light shown in FIG. 5 by setting the fast axis of the waveplate 102a as shown in FIG. 8.

Figure 9:
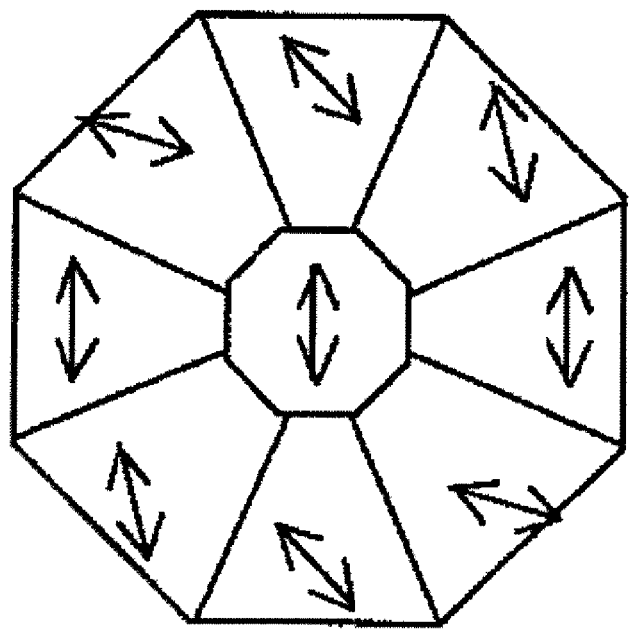
FIG. 9 is a schematic plane view of the polarization adjuster shown in FIG. 8 rotated by 90°.

FIG. 9 is a schematic plane view of the polarization adjuster 100 shown in FIG. 8 rotated by 90°. Since the polarization adjuster 100 has a mechanism that rotates the holder frame 104 (or nine waveplates 102a and 102b as a whole), as described above, the waveplates 102a and 102b shown in FIG. 8 are rotated by 90° around the central rotation axis. Thereby, the fast axes of the waveplates 102a and 102b are rotated by 45° from the initial states. The polarization adjuster 100 shown in FIG. 9 has an effect of further rotating the incident, linearly polarized light by 90° from the initial state shown in FIG. 8. Therefore, the polarization adjuster 100 shown in FIG. 9 can convert the x-polarized light shown in FIG. 7 into the radially polarized light shown in FIG. 6.

The x-polarized light shown in FIG. 7 can be converted into the radially polarized light shown in FIG. 6 without rotating the polarization adjuster 100 by 90°. For example, an incident polarized light rotation mechanism (not shown) converts the incident polarized light into the y-polarized light that is rotated by 90° relative to the x-polarized light shown in FIG. 7, and the converted y-polarized light may be incident upon the polarization adjuster 100 shown in FIG. 8 so as to obtain the radially polarized light. In that case, as shown in FIG. 9, the polarization adjuster 100 is rotated by 45° to convert the light into the tangentially polarized light.

A description will now be given of one illustrative fine adjustment of the polarization state by the polarization adjuster 100. Due to the characteristic and manufacturing error of the lens and mirror in the illumination optical system 14, the incident polarized light upon the polarization adjuster 100 can be linearly polarized light that is misaligned from the perfect x-polarized light shown in FIG. 7.

For example, assume that the incident polarized light shown by an arrow A in FIG. 7 inclines by 2° to the horizontal direction, and this slope angle is referred to as $\alpha$. The polarization state controlled by the polarization adjuster 100 shown in FIG. 8 becomes the tangentially polarized light shown in FIG. 5. However, when the polarized light shown by the arrow A inclines by 2°, an angle $\theta$ between the incident polarized light and fast axis is 43° because the fast axis angle of the half waveplate 102a, through which the polarized light transmits, is 45°. Therefore, the angle of the polarized light emitted from the waveplate 102a turns into $\alpha+2\theta=88°$. In other words, the polarized light emitted from the waveplate 102a having a fast axis angle of 45° is inclined by 2° to the desired linearly polarized light of perpendicularly polarized light.

In measuring the polarization state, the polarization measurement unit 50 shown in FIG. 1 measures this polarized light that is inclined by 2°, and informs the controller 60 that it is misaligned from the desired polarization state of tangentially polarized light. The controller 60 creates a control command of the polarization adjuster 100, and controls driving of the polarization adjuster 100 (waveplates 102a and 102b). More specifically, the controller 60 corrects an angle of the waveplate 102a that receives the polarized light indicated by the arrow A so that an angle $\theta$ becomes 44° between the incident polarized light and the fast axis. Thereby, the angle of the emitted polarized light turns into $\alpha+2\theta=90°$, and becomes desired perpendicularly polarized light. If necessary, after the polarization adjuster 100 is controlled or adjusted, the polarization measurement unit 50 may again measure the polarization state so as to confirm that it is the desired polarized light. The controller 60 controls the angle of the waveplate

102*a* by pushing or pulling, against the spring mechanism 126, the actuator 124 of the waveplate 102*a* that transmits the polarized light that is misaligned from the desired polarization state.

The optical element in the illumination optical system 14, such as a mirror and a lens, exists both before (i.e., at the light source section side of) and after (i.e., at the wafer side of) the polarization adjuster 100. Therefore, even when the polarized light incident upon the polarization adjuster 100 is precisely controlled and the polarization adjuster 100 is also precisely controlled, the polarized light can change due to the optical element after the polarization adjuster 100. When the polarized light of a certain area shifts by an angle α from the desired polarized light, the polarization state can be adjusted to the desired one by driving the waveplates 102*a* and 102*b* by α/2 from the desired angle.

A description will be given of another embodiment of a fine adjustment of a polarization state by the polarization adjuster 100. This embodiment stacks a pair of polarization adjusters 100 in the optical axis direction. The polarization adjuster 100 upon which the light from the light source section 12 is first incident includes a quarter waveplate. The polarization adjuster 100 upon which the light is first incident will be referred to as a first polarization adjuster hereinafter. The polarization adjuster 100 upon which the light from the light source section 12 is next incident includes a half waveplate. The polarization adjuster 100 upon which the light is incident next to the first polarization adjuster will be referred to as a second polarization adjuster hereinafter.

Figure 10A:
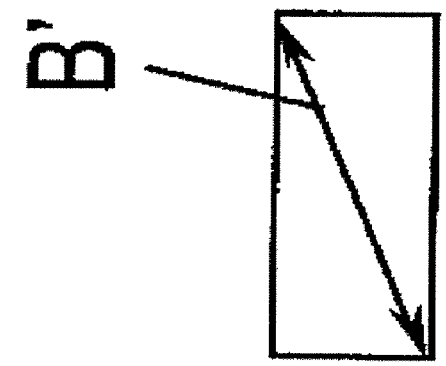
FIG. 10 is a view for explaining a fine adjustment of a polarization state by the polarization adjuster in the exposure apparatus shown in FIG. 1.
Figure 10B:
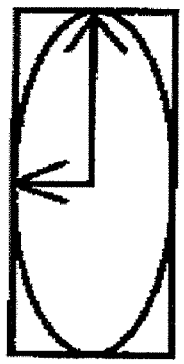
Figure 10C:
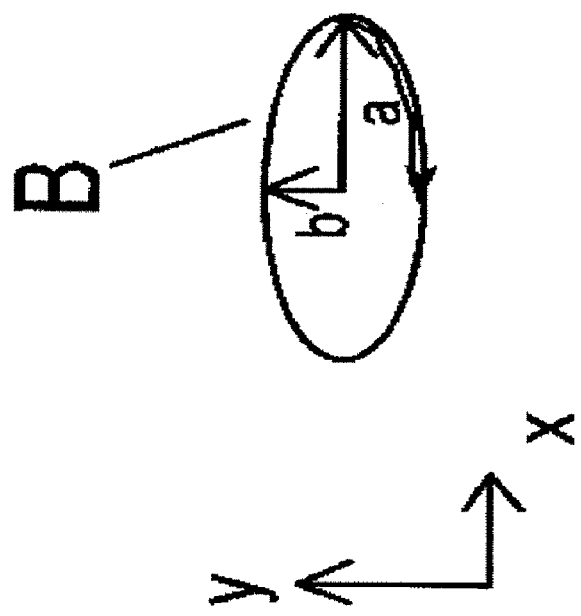

The polarized light incident upon the polarization adjuster 100 can be elliptically polarized light that is misaligned from its desired, perfect x-polarized light shown in FIG. 7 due the characteristics and manufacturing errors of the lens and mirror in the illumination optical system 14. For example, assume right-handed elliptically polarized light that has a major axis along in the x direction and an ellipticity of ε=b/a, as shown with label B in FIG. 10A. When the fast axis of the quarter waveplate in the first polarization adjuster is aligned with the x axis (see FIG. 10B), the polarized light emitted from the first polarization adjuster is converted, as shown in FIG. 10C, into linearly polarized light B' in which an electric field oscillates in a diagonal direction of the rectangle that contacts the elliptically polarized light. In other words, the right-handed elliptically polarized light is converted into the linearly polarized light having a diagonal direction with a positive slope, and left-handed elliptically polarized light into a linearly polarized light having a diagonal direction with a negative slope. The slope angle α of the linearly polarized light B' is α=arc tan(ε), and the half waveplate of the second polarization adjuster is driven, as described above, by α/2=½×arc tan(ε) from the fast axis azimuth shown by the arrows $AD_1$ through $AD_5$ in FIG. 8. Thereby, as shown in FIG. 10C, the elliptically polarized light can be converted into the desired linearly polarized light. Since the light from the light source section 12 is not always incident with a uniform polarization state upon the nine waveplates, it is preferable to calculate an average ellipticity ε of the respective split areas, and to control the first and second polarization adjusters. Similarly, even when the light becomes elliptically polarized light due to the optical component after the first and second polarization adjusters, a desired polarization state can be obtained by controlling the first and second polarization adjusters.

Figures 11A, 11B, 11C:
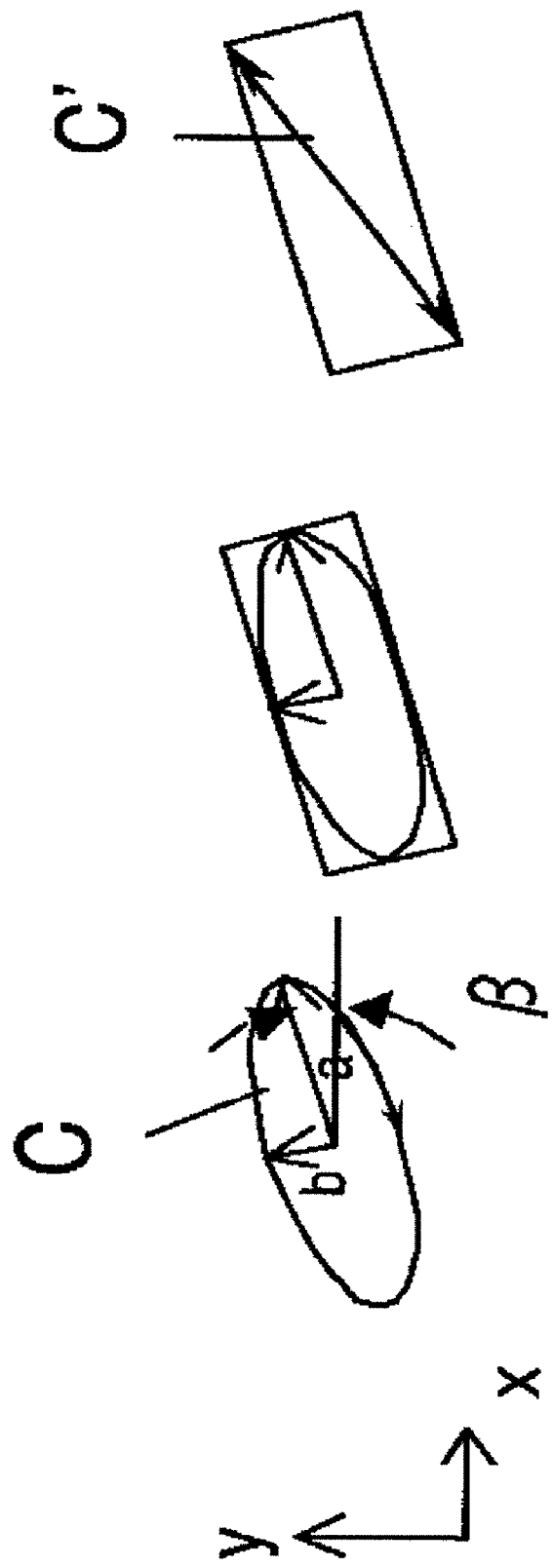
FIG. 11 is a view for explaining a fine adjustment of the polarization state by the polarization adjuster in the exposure apparatus shown in FIG. 1.

FIG. 11A shows right-handed elliptically polarized light C that has an ellipticity of ε=b/a and a major axis angle inclined by β. When the light is incident at a polarization state shown in FIG. 11A upon the polarization adjuster 100, the fast axis of the quarter waveplate in the first polarization adjuster is inclined by β (see FIG. 11B) Thereby, the polarization state shown in FIG. 11A can be converted into the linearly polarized light C' with an oscillation direction α=β+arc tan(ε), as shown in FIG. 11C. When the fast axis angle of the second polarization adjuster is driven from the desired angle by an angle of α/2, a desired polarization state can be obtained. Even when the light becomes elliptically polarized light having an inclined major axis angle due to the characteristics and manufacturing errors of the optical component after the polarization adjuster 100, a desired polarization state can be obtained by controlling the first and second polarization adjusters.

Assume that it is known from the manufacturing errors of the optical element and the characteristics of the light source section 12 that the maximum ellipticity is ε and maximum major axis slope angle is β. Then, the driving range of the waveplate is set to ±β or greater so that the fast axis angle of the quarter waveplate of the first polarization adjuster can be controlled in a range of ±β. Similarly, the drive range of the waveplate is set to ±(arc tan(ε)+β) or greater so that the fast axis angle of the half waveplate of the first polarization adjuster can be controlled in a range of ±(arc tan(ε)+β).

Figure 12:
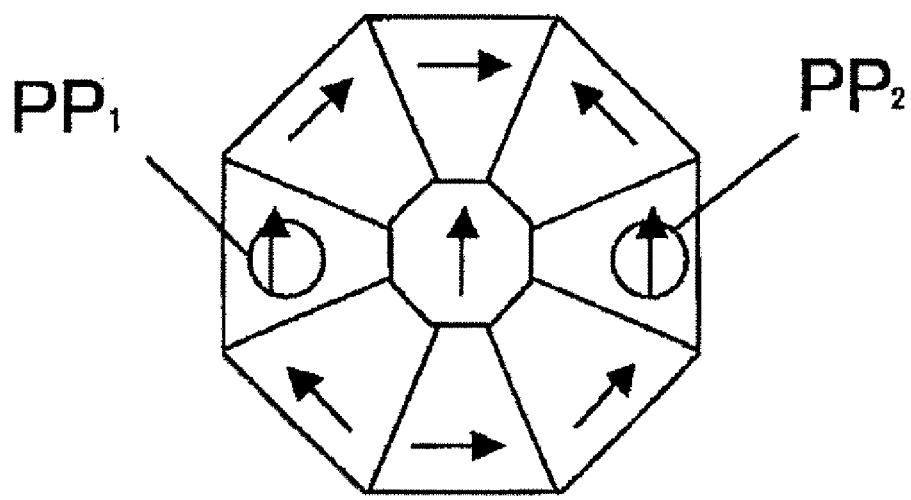
FIG. 12 is a schematic plane view of one illustrative structure of the polarization adjuster when the exposure apparatus shown in FIG. 1 provides a modified illumination.

The polarization adjuster 100 is not limited to the configurations shown in FIGS. 8 and 9. For example, when the exposure apparatus 1 provides a modified illumination, the polarization controller 100 is configured as shown in FIG. 12. This embodiment discusses a dipole illumination as an example of the modified illumination. FIG. 12 is a schematic plane view showing one illustrative structure of the polarization adjuster 100 when the exposure apparatus 1 provides the modified illumination. In FIG. 12, $PP_1$ and $PP_2$ denote effective parts of the illumination distribution of the dipole illumination on the pupil plane of the illumination optical system 14.

Based on the user's input, the controller 60 has information of the next illumination condition for exposure, i.e., a dipole illumination indicated by $PP_1$ and $PP_2$ shown in FIG. 12. Therefore, when the polarization measurement unit 50 measures the polarization state, the controller 60 uses only the internal polarization states of the effective areas $PP_1$ and $PP_2$ in the modified illumination to control the left waveplate so that the inside of $PP_1$ of the polarization adjuster 100 approaches to the desired polarization in average. Similarly, the controller 60 controls the right waveplate so that the inside of $PP_2$ of the polarization adjuster 100 approaches to the desired polarization in average.

Figure 13:
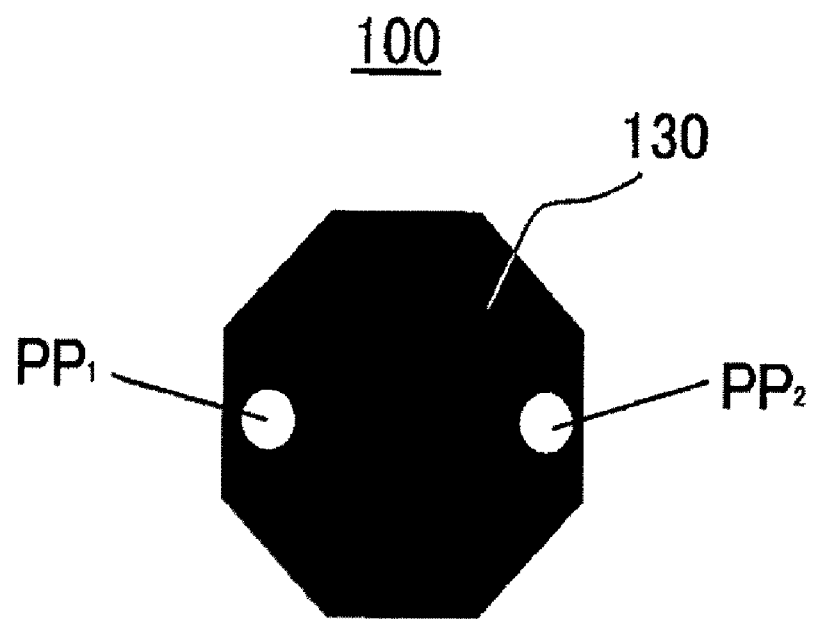
FIG. 13 is a schematic plane view showing one structure of the polarization adjuster when the exposure apparatus shown in FIG. 1 provides a modified illumination.

In actual exposure, a modified illumination control optical system (not shown) illuminates only the areas $PP_1$ and $PP_2$ of the polarization adjuster 100. Alternatively, the modified illumination filter (not shown) is arranged near the pupil position in the illumination optical system 14 so as to shield the light that passes areas other than $PP_1$ and $PP_2$ in the polarization adjuster 100. Of course, as shown in FIG. 13, a modified illumination filter 130 and the polarization adjuster 100 may be integrated. The polarization adjuster 100 shown in FIG. 13 is provided with the modified illumination filter 130 for the dipole illumination. As described above, $PP_1$ and $PP_2$ indicate the effective light source distribution of the dipole illumination. The polarization adjuster 100 shown in FIG. 13 has only the waveplate corresponding to areas $PP_1$ and $PP_2$. The controller 60 drives, based on the polarization state measured by the polarization measurement unit 50, the left waveplate so that the polarization state of $PP_1$ approaches to the desired polarization state, and right waveplate so that the polarization state of $PP_2$ approaches to the desired polarization state. For the modified illumination other than the dipole illumination, the modified illumination filter corresponding to the modified illumination is provided or attached to the polarization adjuster 100. In that case, the modified illumination filter having a movable part may be integrated.

This embodiment discusses the dipole illumination as one illustrative modified illumination. However, for another modified illumination, such as a quadrupole illumination, a quintet-pole illumination, and an annular illumination, the controller 60 utilizes information of the illumination condition and provides such control that the polarization state at the illumination effective part of the polarization adjuster 100 preferentially approaches to a desired polarization condition.

Figure 14:
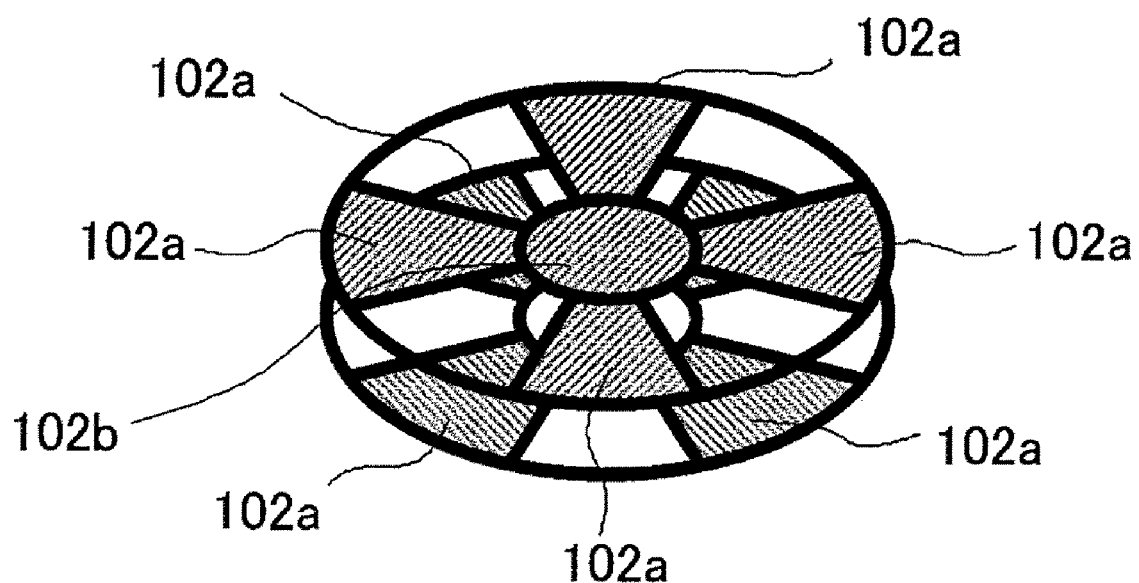
FIG. 14 is a schematic perspective view of one illustrative structure of the polarization adjuster in the exposure apparatus shown in FIG. 1.

The polarization adjuster 100 causes physical interference of mechanical parts of the adjacent waveplates. Accordingly, the adjacent waveplates 102a are preferably separated in the optical axis direction as shown in FIG. 14 so as to avoid the adjacent arrangement of them. In other words, the waveplate 102a is arranged on two planes in the optical axis direction. In FIG. 14, four waveplates 102b and central waveplate 102b are arranged on the top surface, and four remaining waveplates 102a are arranged on the bottom surface. Of course, the four waveplates 102a on the top surface and the four waveplates 102a on the bottom surface are arranged so that the waveplates 102a have no apertures when viewed from the light source (like the polarization adjuster 100 in FIG. 3). Here, FIG. 14 is a schematic perspective view of a structure of the polarization adjuster 100.

The above polarization adjuster 100 arranges eight waveplates 102a at a circumferential part and one waveplate 102b at the center so as to independently control the polarization states at eight areas. However the present invention does not limit the locations and the number of independently controllable areas of the polarization state in the polarization adjuster 100.

Figure 15:
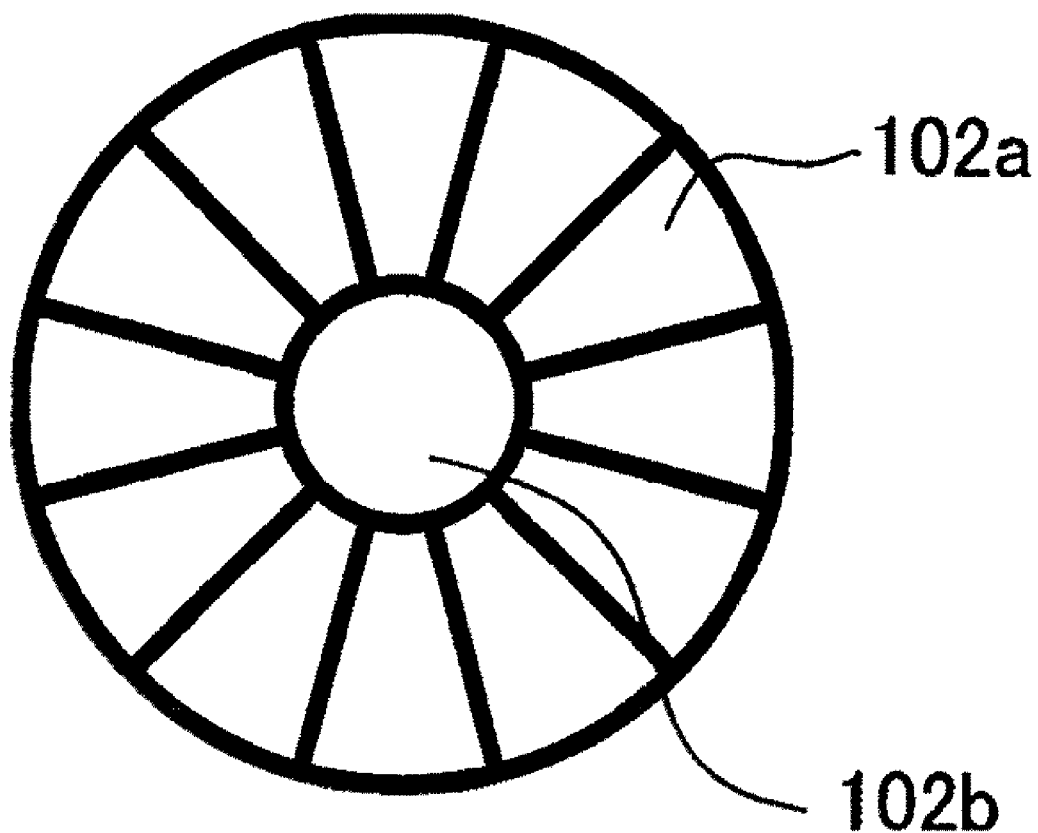
FIG. 15 is a schematic perspective view of one illustrative structure of the polarization adjuster in the exposure apparatus shown in FIG. 1.

For example, the polarization adjuster 100 may arrange twelve waveplates 102a at the circumferential part and the waveplate 102b at the center, as shown in FIG. 15, so as to independently control the polarization states at thirteen areas. The polarization adjuster 100 shown in FIG. 15 divides plural independently controllable areas of the polarization state of the circumferential part into twelve equal parts, and can form a smoother polarization state, for example, in the annular illumination. The polarization adjuster 100 shown in FIG. 15 has a circular shape, different from a polygonal shape of the polarization adjuster 100, for example, shown in FIG. 3. Thus, the entire shape is not limited as long as the polarization adjuster 100 covers the necessary effective light source distribution. The central waveplate 102b is replaced with a driving waveplate, fixed waveplate, or a transparent glass material, if necessary. Moreover, the polarization adjuster 100 may divide the independently controllable area of the polarization state in the circumferential direction by eliminating the central section.

Turning back to FIG. 1, a description will be given of an operation of the exposure apparatus 1, in particular, the polarization adjustment by the polarization measurement unit 50, the controller 60, and the polarization adjuster 100. The exposure apparatus 1 initializes the light source section 12, the illumination optical system 14, and the polarization adjuster 100 to create a desired polarization illumination state. The light from the light source section 12 illuminates the reticle 20 via the illumination optical system 14. The polarization measurement unit 50 moves to the reticle plane position via the reticle stage 25, and measures the polarization state of the illumination optical system 14 (or the light that illuminates the reticle 20). The polarization measurement unit 50 two-dimensionally measures the effective light source distribution and the polarization state of the illumination optical system 14.

The measurement result of the polarization measurement unit 50 is sent to the controller 60. The polarization state measured by the polarization measurement unit 50 may shift from the desired polarization state. This shift results from a manufacturing error, an installation error, and a driving error of the waveplate in the polarization adjuster, as well as the birefringence of the lens in the illumination optical system 14.

The controller 60 calculates an average shift amount for each of the effective areas of the nine waveplates 102a and 102b in the polarization adjuster 100 shown in FIG. 3 from the desired polarization state, and calculates an elliptic correction amount and a rotational correction amount. The controller 60 controls driving of the waveplate in the polarization adjuster 100 using the calculated elliptic correction amount and rotational correction amount as a correction driving amount. The quarter waveplate of the first polarization adjuster is driven based on the elliptic correction amount. The half waveplate of the second polarization adjuster is driven based on the rotational correction amount. When the polarization state is corrected or adjusted, the polarization measurement unit 50 again measures the polarization state, if necessary, and the correction or adjustment of the polarization state may be repeated. Thus, the polarization state of the light used to illuminate the reticle 20 can be converted into the desired polarization state. When the polarization control ends, the exposure apparatus 1 feeds the reticle 20 via the reticle stage 25, and exposes the wafer 40 at a desired polarization state.

In exposure, the light is emitted from the light source section 12 illuminates the reticle 20 via the illumination optical system 14. The light that passes through the pattern of the reticle 20 is imaged onto the wafer 40 by the projection optical system 30. The exposure apparatus 1 includes the polarization measurement unit 50, the controller 60, the polarization adjuster 100, and can expose the wafer 40 with a desired polarization state. The exposure apparatus 1 can adjust the polarization state without detaching the polarization adjuster 100 from the apparatus, and handle changes with time of the polarization state. Therefore, the exposure apparatus 1 can provide higher quality devices than ever, such as semiconductor devices and LCD devices, with high throughput and economic efficiency.

Figure 16:
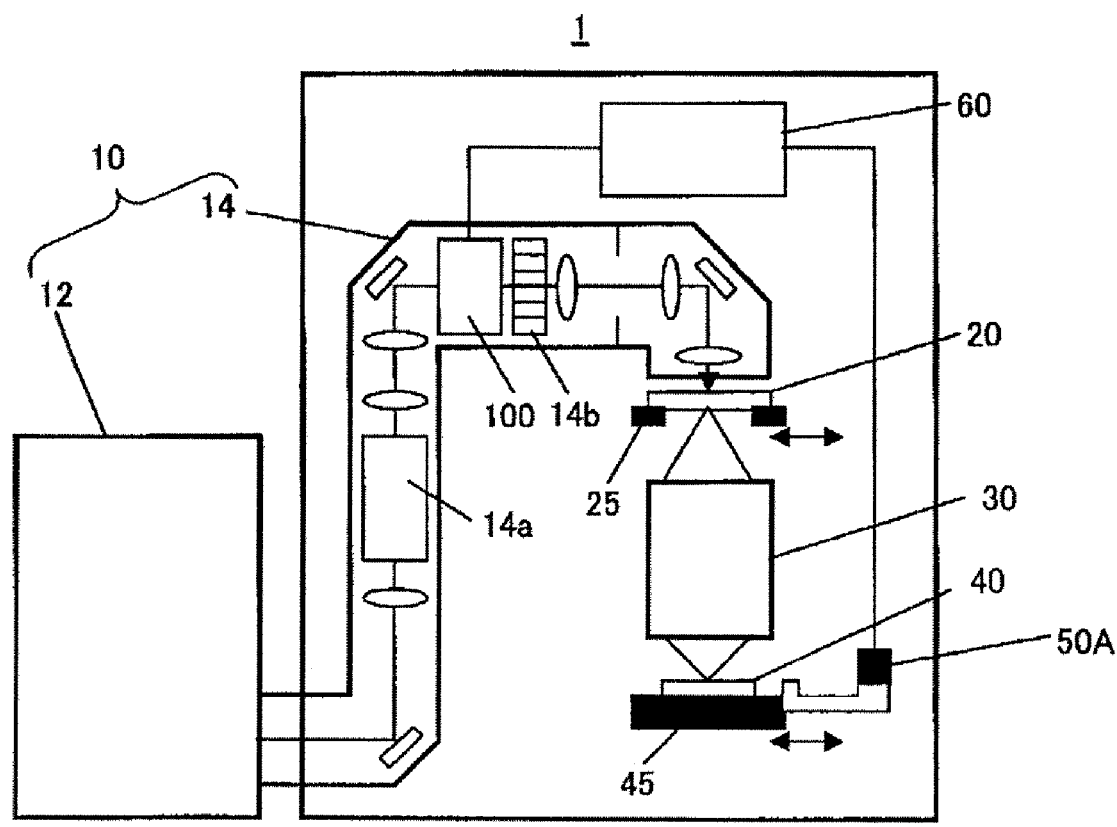
FIG. 16 is a schematic sectional view showing a structure of an exposure apparatus according to another aspect of the preset invention.

The polarization measurement unit 50 that measures the polarization state may be arranged on the wafer stage 45, as shown in FIG. 16.

When the polarization measurement unit 50 is arranged on the wafer stage 45, the polarization measurement unit 50 on the wafer stage 45 moves to a position below the image point of the projection optical system 30 under control of the controller 60. If necessary, a pinhole mask may be arranged at a position of the reticle 20 or the wafer 40 to specify an angle of view that measures a polarization state. The illumination optical system 14 fully opens the pupil in measuring its overall polarization state, and sets the pupil to a desired shape in measuring a polarization state in a specific effective light source distribution, such as a modified illumination. The polarization state measured by the polarization measurement unit 50 contains influence of the birefringence of the projection optical system 30, because of the intervention of the projection optical system 30. For example, when the polarization state is calculated with a Jones vector, data of the pre-measured birefringence distribution of the projection optical system 30 is multiplied by an inverse matrix of the Jones vector in accordance with the birefringence so as to obtain the polarization that has no influence of the projection optical system 30. When the birefringence of the polarization optical system 30 is negligibly small, the measurement result of only the influence of the illumination optical system 14 can be obtained even when the projection optical system 30 is used for the measurement. The controller 60 compares the measurement result of the polarization measurement unit 50 with the desired polarization state, and controls the polarization adjuster 100 to the desired polarization state when there is a shift between them.

The exposure apparatus shown in FIG. 16 can also control a polarization state of a specific exposure pattern. In this case, a specific periodic pattern is arranged on the reticle 20. The periodic pattern may be only for measurement use or for actual exposure.

The diffracted light generated when the periodic pattern of the reticle 20 is illuminated passes part of the pupil of the projection optical system 30, and is measured by the polarization measurement unit 50 on the wafer stage 45. The polarization measurement unit 50 measures the polarization state within a pupil plane of the projection optical system 30. The controller 60 compares the polarization state on the pupil plane with the desired polarization state, and controls or drives the polarization adjuster 100 so that the measured polarization state approaches to the desired polarization state. This embodiment splits the lights from the illumination optical system 14 through diffractions, and thus one point in the polarization adjuster 100 arranged in the illumination optical system 14 does not correspond to one point on the pupil of the projection optical system 30 on the one-by-one correspondence basis. Therefore, although a polarization state at one point can be set to a desired polarization state, another part may not. In addition, the birefringence of the projection optical system 30 affects each diffracted light differently. Moreover, control over the polarization state can need plural measurements and controls of a polarization state.

Figure 17:
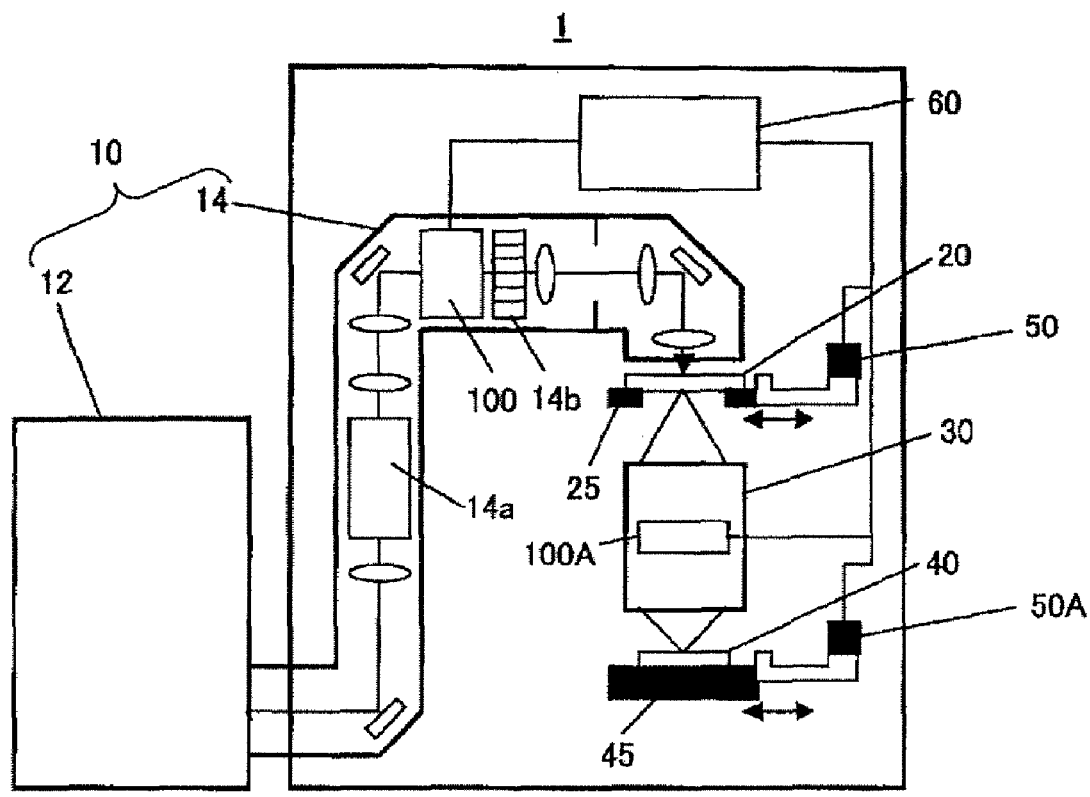
FIG. 17 is a schematic sectional view showing a structure of an exposure apparatus according to another aspect of the preset invention.

Accordingly, the polarization measurement units 50 and 50A may be arranged, as shown in FIG. 17, on the reticle stage 25 and the wafer stage 45 as well as the polarization adjuster 100 and 100A arranged in the illumination optical system 14 and the projection optical system 30. The polarization adjuster 100A is configured similar to the polarization adjuster 100, and the polarization measurement unit 50A is configured similar to the polarization measurement unit 50. Therefore, a detailed description of them will be omitted. Here, FIG. 17 is a schematic sectional view showing a structure of the exposure apparatus 1 according to one aspect of the present invention.

The polarization measurement unit 50 receives the light that has just emitted from the illumination optical system 14, and feeds the measurement result back to the polarization adjuster 100 in the illumination optical system 14 via the controller 60 so that the measured polarization state approaches to the desired one. Concrete polarization state control is as described above.

On the other hand, the polarization measurement unit 50A acts as if the polarization measurement unit 50 is arranged on the wafer stage 45. In the meantime, when the polarization state of the illumination optical system 14 has a residue error in an analysis, the residue error is assumed to appear in the measurement result by the polarization measurement unit 50. On the premise of the residue error, the measurement result by the polarization measurement unit 50A is processed, and the polarization error influenced by the polarization optical system 30 is separated. Therefore, the polarization adjuster 100A arranged on the pupil plane in the projection optical system 30 corrects or adjusts the polarization state caused by the influence by the birefringence of the projection optical system 30 to a desired one. A position of the polarization adjuster does not have to always accord with the pupil position in the projection optical system, and may be near the pupil position as long as the polarization adjuster acts as if it is provided on the pupil position.

The exposure apparatus 1 shown in FIG. 17 can control the polarization state of the light that reaches or images on the wafer 40, which includes a shift from a desired polarization state caused by the illumination optical system 14 and a shift from the desired polarization state caused by the projection optical system 30. In other words, the controller 60 controls the polarization adjuster 100 in the illumination optical system 14 or the polarization adjuster 100A in the projection optical system 30 based on the measurement results by the polarization measurement units 50 and 50A so as to obtain a desired polarization state. However, as discussed above, the polarization state on the pupil plane of the projection optical system 30 to the desired pattern does not corresponds to the polarization adjuster 100 in the illumination optical system 14 on the one-to-one correspondence basis. Accordingly, the exposure apparatus 1 show in FIG. 17 controls both the polarization adjuster 100A in the projection optical system 30 and the polarization adjuster 100, and realizes a desired polarization state suitable for exposure.

Figure 18:
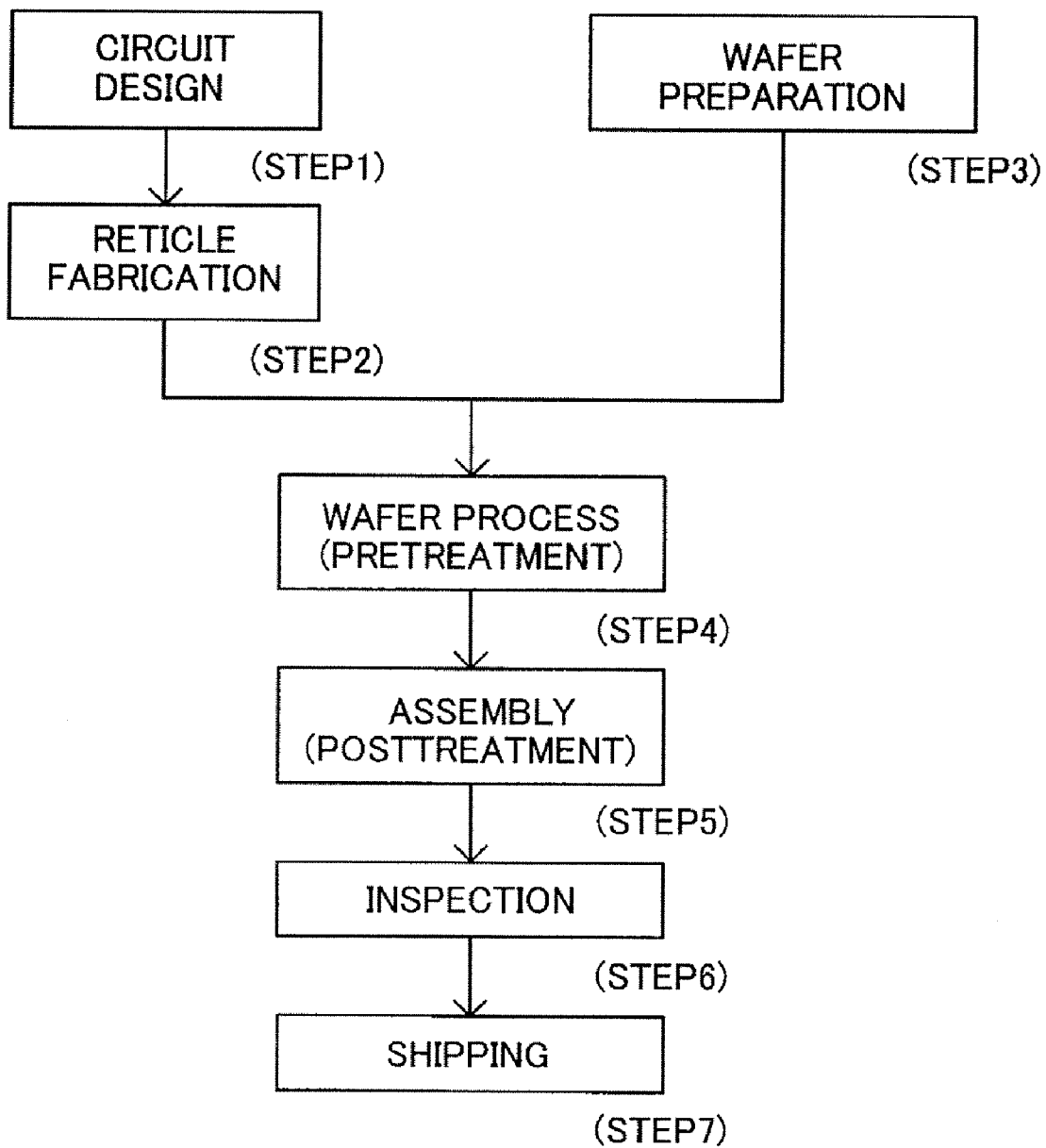
FIG. 18 is a flowchart for explaining a fabrication of a device.
Figure 19:
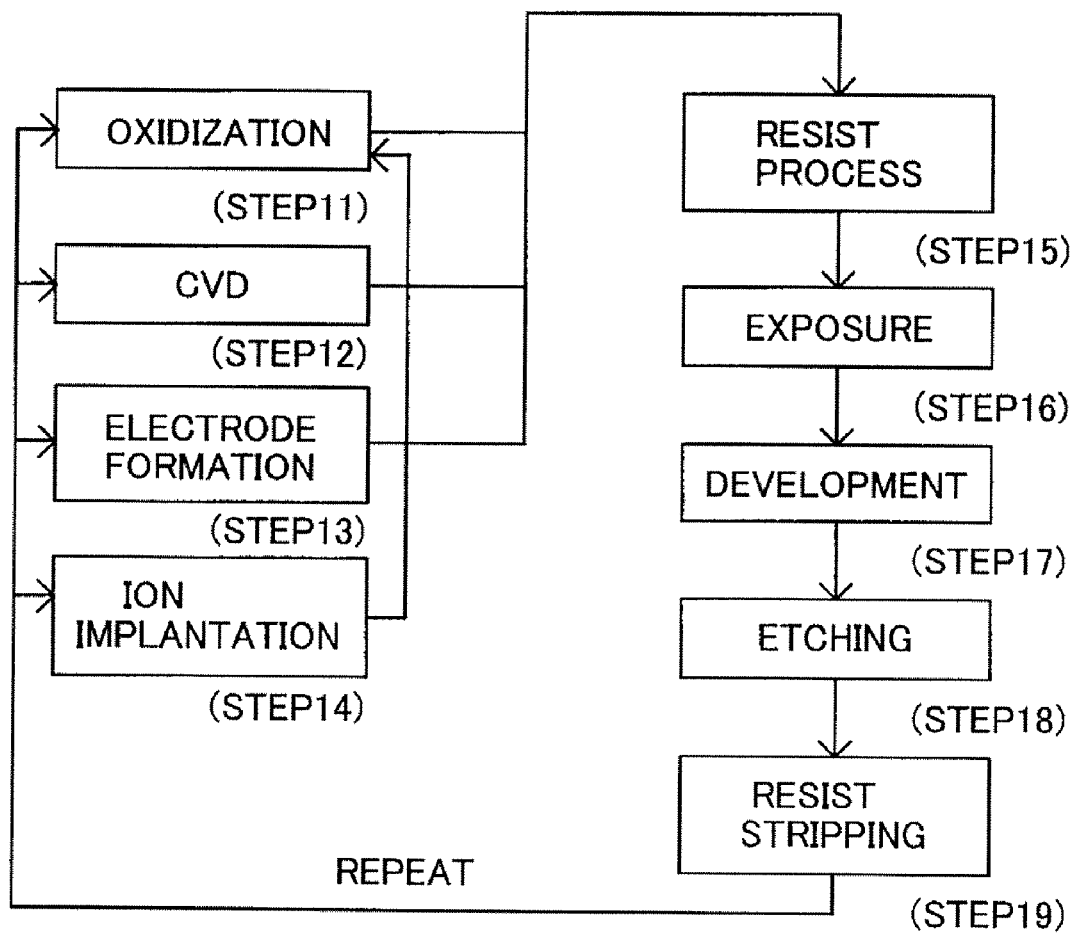
FIG. 19 is a flowchart for a wafer process of step 4 shown in FIG. 18.

Referring now to FIGS. 18 and 19, a description will be given of an embodiment of a device manufacturing method using the exposure apparatus 1. FIG. 18 is a flowchart for explaining how to fabricate devices, such as a semiconductor device and a LCD device. Here, a description will be given of the fabrication of a semiconductor device as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 19 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 1 to expose a circuit pattern of the reticle onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device manufacturing method of this embodiment may manufacture higher quality devices than ever. Thus, the device manufacturing method using the exposure apparatus 1, and resultant devices constitute one aspect of the present invention.

Further, the present invention is not limited to these preferred embodiments and various variations and modifications may be made without departing from the scope of the present invention.

This application claims a foreign priority benefit based on Japanese Patent Application No. 2006-037422, filed on Feb.

15, 2006, which is hereby incorporated by reference herein in its entirety as if fully set forth herein.

What is claimed:

1. An exposure apparatus comprising:
   an illumination optical system configured to illuminate a reticle;
   a projection optical system configured to project a pattern of the reticle onto a substrate;
   a polarization adjuster configured to independently adjust each polarization state of a plurality of areas in an effective light source distribution used to illuminate the reticle;
   a polarization measurement unit configured to measure a polarization state of light that has passed the polarization adjuster; and
   a controller configured to independently control each polarization state of the plurality of areas via the polarization adjuster based on a measurement result of the polarization measurement unit,
   wherein the polarization adjuster is divided into the plurality of areas, each area including a waveplate whose initial fast axis angle is set so as to form the desired polarization state, and the controller is configured to independently correct the fast axis angle of each waveplate based on the measurement result of the polarization measurement unit.

2. An exposure apparatus according to claim 1, wherein the each waveplate is arranged on a plane perpendicular to an optical axis of the illumination optical system.

3. An exposure apparatus according to claim 1, wherein the each waveplate stacks in an optical axis direction of the illumination optical system.

4. An exposure apparatus according to claim 1, wherein the polarization adjuster is arranged at a pupil position in the illumination optical system.

5. An exposure apparatus according to claim 1, wherein the polarization adjuster is arranged at a pupil position in the projection optical system.

6. An exposure apparatus according to claim 1, wherein the controller independently controls a rotation of the each waveplate based on the measurement result of the polarization measurement unit.

7. An exposure apparatus according to claim 1, wherein the polarization measurement unit measures a polarization state of the light that has passed at least part of the illumination optical system.

8. An exposure apparatus according to claim 1, wherein the polarization measurement unit measures a polarization state of the light that has passed at least part of the projection optical system.

9. An exposure apparatus according to claim 1, wherein each area of the polarization adjuster includes a pivot mechanism that serves as an axis of rotation of the waveplate and an actuator that moves the waveplate in response to a command from the controller.

10. A device manufacturing method comprising the steps of:
   exposing a substrate using an exposure apparatus; and
   developing the substrate that has been exposed,
   wherein the exposure apparatus includes an illumination optical system configured to illuminate a reticle, a projection optical system configured to project a pattern of the reticle onto a substrate, a polarization adjuster configured to independently adjust each polarization state of a plurality of areas in an effective light source distribution used to illuminate the reticle, a polarization measurement unit configured to measure a polarization state of light that has passed the polarization adjuster, and a controller configured to independently control each polarization state of the plurality of areas via the polarization adjuster based on a measurement result of the polarization measurement unit,
   wherein the polarization adjuster is divided into the plurality of areas, each area including a waveplate whose initial fast axis angle is set so as to form the desired polarization state, and the controller is configured to independently correct the fast axis angle of each waveplate based on the measurement result of the polarization measurement unit.

* * * * *